United States Patent [19]

Adams

[11] Patent Number: 5,508,625
[45] Date of Patent: Apr. 16, 1996

[54] VOLTAGE STAND OFF CHARACTERISTICS OF PHOTOCONDUCTOR DEVICES

[75] Inventor: Jeffrey C. Adams, Renton, Wash.

[73] Assignee: The Boeing Company, Seattle, Wash.

[21] Appl. No.: 264,400

[22] Filed: Jun. 23, 1994

[51] Int. Cl.⁶ .................................................. G01R 27/08
[52] U.S. Cl. ........................................ 324/702; 250/214.1
[58] Field of Search .................................. 324/702, 501, 324/772, 773; 250/214.1

[56] References Cited

U.S. PATENT DOCUMENTS

| | | | |
|---|---|---|---|
| 3,024,695 | 3/1962 | Nisbet | 250/214.1 |
| 4,063,281 | 12/1977 | Kornreich et al. | 250/214.1 |
| 4,425,501 | 1/1984 | Stauffer . | |
| 4,746,793 | 5/1988 | Hopkins . | |
| 4,771,168 | 9/1988 | Gundersen et al. | 250/214.1 |
| 4,772,784 | 9/1988 | Yoshitoshi et al. . | |
| 4,807,956 | 2/1989 | Tournereau et al. . | |
| 4,808,812 | 2/1989 | Tanaka et al. . | |
| 4,825,061 | 4/1989 | Schoenbach et al. | 250/214.1 |
| 4,850,692 | 7/1989 | Hirao et al. . | |
| 4,916,303 | 4/1990 | Schoenbach et al. | 250/214.1 |
| 4,948,960 | 8/1990 | Simms et al. . | |
| 5,022,725 | 6/1991 | Matsunami et al. . | |
| 5,138,677 | 8/1992 | O'Shaughnessy et al. . | |
| 5,196,692 | 3/1993 | Arinaga et al. | 250/214.1 |
| 5,315,104 | 5/1994 | Plumb | 250/214.1 |

*Primary Examiner*—Maura K. Regan
*Attorney, Agent, or Firm*—Mary Y. Redman

[57] ABSTRACT

The invention provides a way to improve the voltage stand-off characteristics of photoconductors, including both surface and bulk photoconductors. In a preferred embodiment, the invention comprises a photoconductor device having a semiconductor substrate with electrodes thereon, and a light source which illuminates the surface of the device in a pattern which is configured to increase the stand-off voltage of the device. A method according to the invention includes the steps of directing light onto the surface of the photoconductor thereby forming an illuminated area thereon, measuring the current draw of the photoconductor, and moving the illuminated area along the surface of the photoconductor until the current draw is minimized.

14 Claims, 4 Drawing Sheets

VOLTAGE STAND OFF CHARACTERISTICS OF PHOTOCONDUCTOR DEVICES

FIELD OF THE INVENTION

This invention relates to optically activated semiconductor devices.

BACKGROUND OF THE INVENTION

When operating a semiconductor device which converts optical signals to electrical signals, such as an optically activated switch or an optical detector, one wants to achieve the most efficient optical to electrical conversion possible. In the devices like an optically initiated switch, a strong switch turn-on is generally desirable. Some types of optical switches rely on an avalanche effect to activate them.

To achieve these ends, it is necessary for the device to sustain large voltages or, as it is sometimes referred to, have a high voltage stand-off. High voltages generally translate into more efficient optical to electrical conversions and to stronger switch turn-on. High voltages (generally in the range of several kilovolts) are a requirement to achieve avalanche in non-linear, optically initiated switches.

Where high voltage stand-off is desirable, it is also desirable that the electrode spacing between anode and cathode be sufficiently small so that carrier transit times and/or electromagnetic wave propagation times are short. This results in a fast response time. A preferred electrode gap may range from tens of microns to several millimeters. Unfortunately, high stand-off voltages are usually incompatible with such small gaps between electrodes. Devices with close electrode spacing often have poor voltage hold-off characteristics. One cause of this deficiency is due to high field points in, under, and/or around the electrode metallization which leads to high carrier injection into the semiconductor. As discussed in the article "Contact and Metallization Problems in GaAs Integrated Circuits," *Journal of Vacuum Science and Technology,* A 4(6), Nov./Dec. 1986 pp. 3085–3090 by N. Braslau, the assumption of perfect planar Schottky or ohmic contacts often cannot predict the measured current-voltage (I–V) characteristics of a device. Braslau found that a theoretical model which included high-field defect points at the contact could explain many experimental observations. These are random microscopic defects that can produce localized high field regions. In fact, a lower contact resistance was experimentally correlated with a higher density of defects at the contacts. In the classes of devices considered here, a good barrier at the contacts is actually desirable so that large voltages can be applied without large dark currents. High field points caused by structural, chemical, or other physical states tend to produce a poor barrier. Because such defects are difficult to control during fabrication, it is common to see surface photoconductors that are similar in geometry, metallization, and material, yet have vastly different I–V characteristics. For example, it is not uncommon to have two similar devices fabricated by the same process, one of which will hold-off high voltage while the other will not.

Such defects may also affect the operation of bulk photoconductors, such as the bulk avalanche semiconductor switch (BASS) described in U.S. Pat. Nos. 4,891,815, 4,218,618, 4,438,331 and 4,782,222. Such devices often cannot be used with a DC high voltage bias because of their poor voltage hold-off characteristics. For this reason, pulsed power supplies, which are expensive and bulky, must be used instead with BASS devices.

A method used to increase voltage stand-off and reduce device dark current in semiconductor photodectors is to fabricate special barrier enhancement layers of certain materials under the metallization in order to effectively increase the so-called barrier height of the contact/semiconductor junction. A discussion and example of such special engineering and fabrication is given by J. I. Chyi et al. in "Low dark current and high linearity InGaAs MSM photodetectors," *Electronic Letters,* Vol. 30, p. 355, Feb. 17, 1994. This approach requires highly sophisticated engineering and fabrication techniques which entail considerable expense.

From this brief background, it would clearly be desirable if a device with poor voltage stand-off characteristics could be modified to have good voltage stand-off characteristics. This invention provides an inexpensive and simple way for imparting good stand-off characteristics.

SUMMARY OF THE INVENTION

The invention provides a way to improve the voltage stand-off characteristics of photoconductors, including both surface and bulk photoconductors such as (for example) n-i-n, p-i-n, and general metal-semiconductor-metal (MSM) photodiodes, and optical switches used for the production of electrical pulses such as BASS switches. The invention enhances the performance of a photoconductor device without resort to expensive or complex techniques for the fabrication of special barrier enhancement layers.

In a preferred embodiment, the invention comprises a photoconductor device having a semiconductor substrate with electrodes thereon, and a light source which illuminates the surface of the device in a pattern which is configured to increase the stand-off voltage of the device. The light can be imaged onto the photoconductor by optical elements such as lenses or a mask to achieve the best results. Preferably, the light is directed to the boundary between one of the electrodes and said substrate.

A method according to the invention includes the steps of directing light onto the surface of the photoconductor thereby forming an illuminated area thereon, measuring the current draw of the photoconductor; and moving the illuminated area along the surface of the photoconductor until the current draw is minimized.

DESCRIPTION OF A PREFERRED EMBODIMENT

Figure 1:
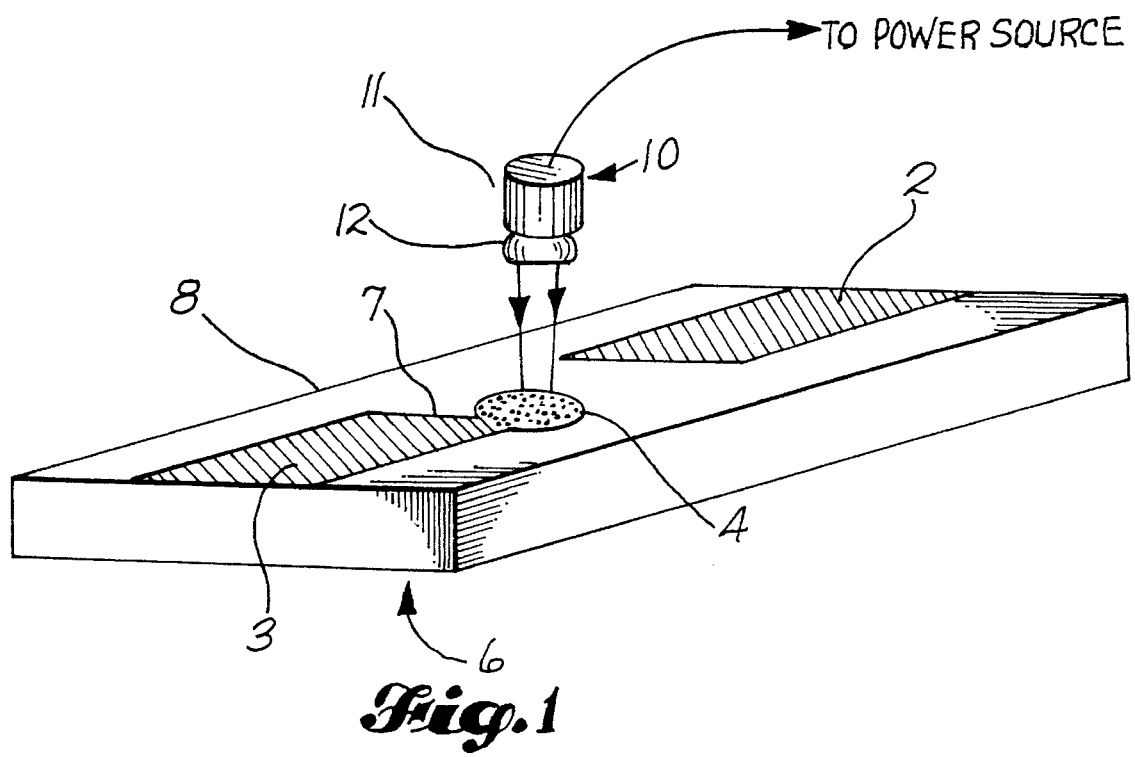
FIG. 1 is a schematic representation of a preferred embodiment of the invention.

For illustrative purposes, FIG. 1 shows an example of a photoconductor device 6 which includes a semiconductor substrate 8 with a pair of electrodes, or contacts, 2, 3 thereon. Although a surface photoconductor, i.e., one with a pair of electrical contacts on the same side of the device, has been illustrated, it will be understood that the invention is also applicable to bulk photoconductors, i.e., those with contacts opposite sides of a substrate. A preferred contact 2, 3 uses an n+epilayer between the semiconductor substrate 8 and metallization, although any contact type known to those skilled in the art is usable in connection with the invention. Improved voltage stand-off characteristics are achieved by applying light to selected surface areas 4 of the device 6 to inhibit current injection from the contact 3 into the semiconductor substrate material. As the inventor has observed, photoconductor performance is enhanced by such an illumination of the surface of the device 6 near the cathode contact/semiconductor boundary 7. The resistance of the device is effectively increased by application of light in this manner.

The mechanism responsible for this effect may be the "screening" nature of the optically injected plasma around high-field points. The intentional application of background illumination may effectively smooth out the microscopic and/or macroscopic roughness of the semiconductor-metal interface. Alternatively, it is well known that most of the below band gap absorption in GaAs is due to the deep level complex "EL2." Thus, it is also possible that these defect levels change state with illumination near the contact to inhibit carrier injection through an effective increase in contact-semiconductor barrier height, which would again increase the effective device resistance.

As shown in FIG. 1, this concept can be implemented with a light source 10 such as movable, near-IR LED 11 placed above or to the side of a photoconductor. Other light sources such as, for example, a laser or tungsten incandescent lamp with sufficient near-IR spectral content, could also be used. A focusing lens 12 may be provided to form a light pattern with the desired degree of magnification or focus. The light source 10 is positioned so as to illuminate a localized area 4 or an entire electrode.

The illumination is preferably directed to a region largely near the majority carrier injecting contact. For a surface device geometry, the illumination would preferably occur around the boundary between the metallic contact and the semiconductor. For a bulk device geometry, one or more electrodes would preferably be semi-transparent so that the illumination on an electrode surface would sufficiently penetrate into the semiconductor to enhance voltage stand-off. Since it has been found to be preferable to have the illumination nearer to one electrode than the other, the wavelength of the light should be chosen such that the light absorption into the semiconductor is predominantly near one electrode. Since light absorption as function of wavelength differs depending on the semiconductor type (e.g., GaAs, Si, InP, CdS, etc.), the wavelength of light used in a particular embodiment of the invention should be chosen based on the light absorption characteristics of the particular semiconductor material being used, to best achieve the desired effect. A person having ordinary skill in the art can select the illumination pattern that gives best results for the particular photoconductor device being used.

Figure 2:
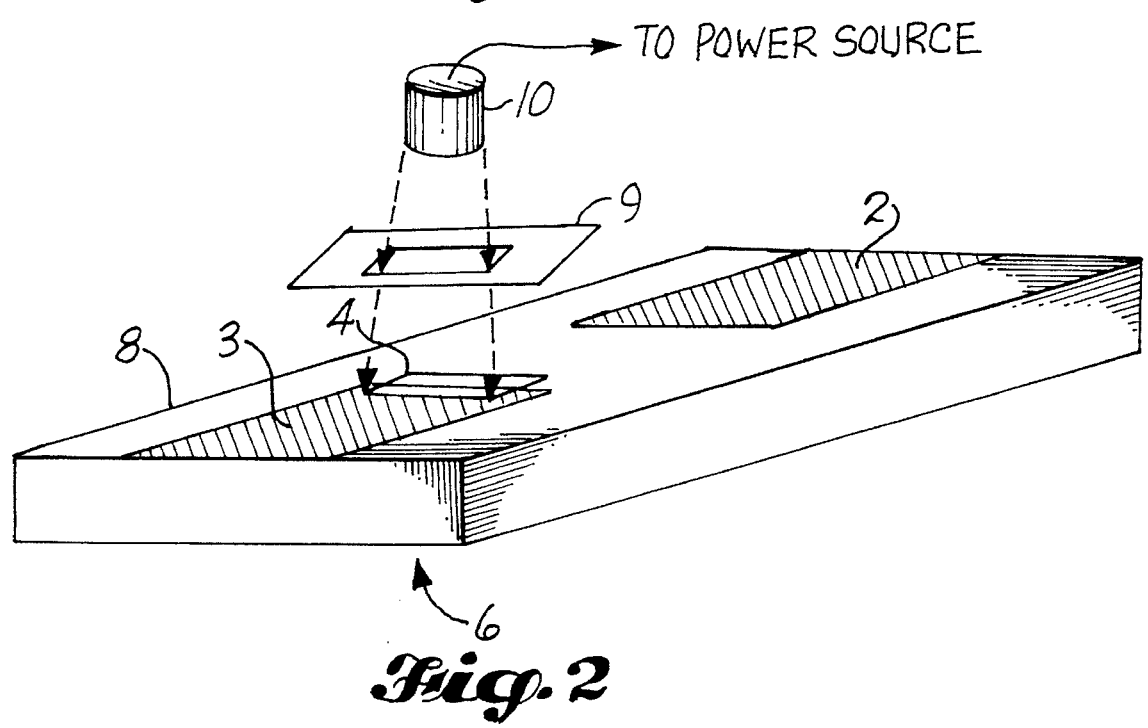
FIG. 2 is a schematic representation of a second preferred embodiment of the invention.

Referring to FIG. 2, alternatives for varying the illumination pattern include an adjustable optical mask 9 positioned above the photoconductor 6 and in front of the light source 10. Suitable optics can be chosen to image the mask 9 with varying magnifications as desired. While the location, intensity and pattern of the illumination spot can be optimized for best performance of the device, it will be evident to those of ordinary skill in the art that the optics can also be optimized to achieve minimum current draw. The illumination from an LED, laser or other source could also be directed to the photoconductor via an optical fiber or fibers to minimize the obtrusiveness of the light source. This could be useful if space in the area surrounding the photoconductor device is limited.

A light intensity on the order of tens of microwatts or less can provide dramatic improvement in high voltage stand-off. By adjusting and adapting the optics which direct the light onto the device for optimal illumination, light intensities under ten microwatts may be sufficient. In general, the larger the area to be illuminated, the greater the required intensity. It appears that roughly 1 microwatt per square millimeter would be the minimum power density required for millimeter gap spacings. Even less power density may be sufficient for very small gap spacings (under 0.1 mm, for example).

Figure 3:
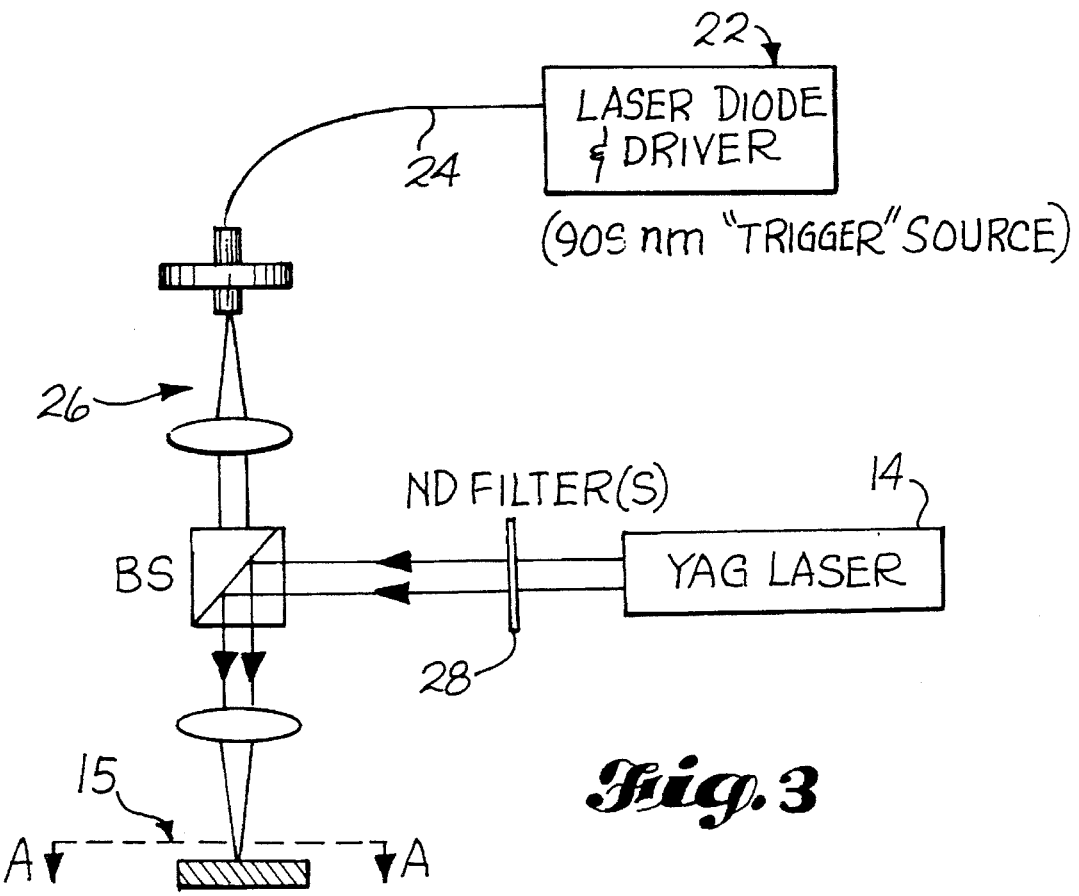
FIG. 3 is a schematic representation of an experiment used to investigate the effect of background illumination or photoconductor performance.
Figure 4:
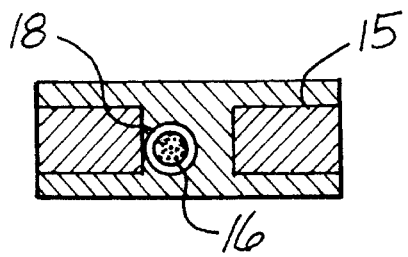
FIG. 4 is a view taken along line A—A of FIG. 3.
Figure 5:
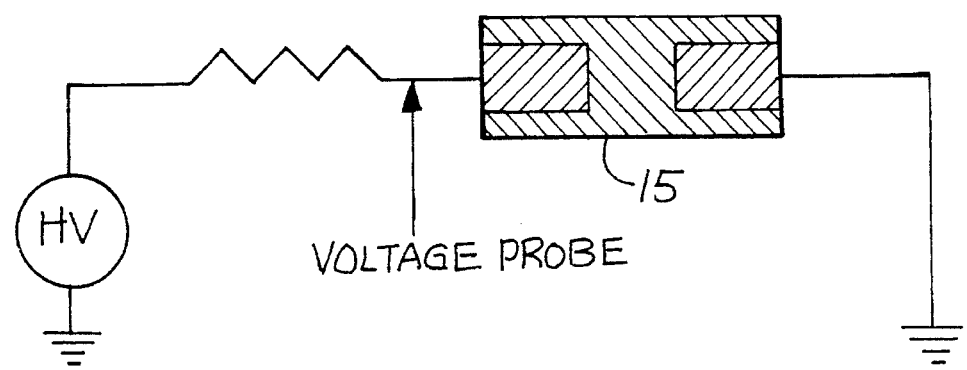
FIG. 5 is a schematic of a circuit used in the experiment of FIG. 3.

Referring to FIGS. 3, 4 and 5, experimentation has shown that improved voltage stand-off is achieved by illumination of areas around contacts on the photoconductor device as explained above. A number of n-i-n surface photoconductors were tested in the configuration shown in FIGS. 3, 4 and 5. A YAG laser 14 was used to illuminate a spot 16 (shown in FIG. 4) on the test device 15 with a particular power and location which could be varied near an electrode 18 on the test device 15 to minimize the total current flow in the circuit shown in FIG. 5. A 905 nm laser light source 22 supplied light to trigger the test device 15 through an optical fiber 24 and imaging optics 26. This light was blocked off for these tests except when optically initiated avalanche was desired. The procedure was to first steer a low intensity spot around an electrode while the voltage across the device was monitored. After choosing a location which gave a maximum device hold-off at a particular applied voltage, the intensity of the illumination spot was changed with a variable neutral density filter 28 to maximize the device voltage hold-off (corresponding to a minimum device current) measured in the circuit of FIG. 5.

Figure 6A:
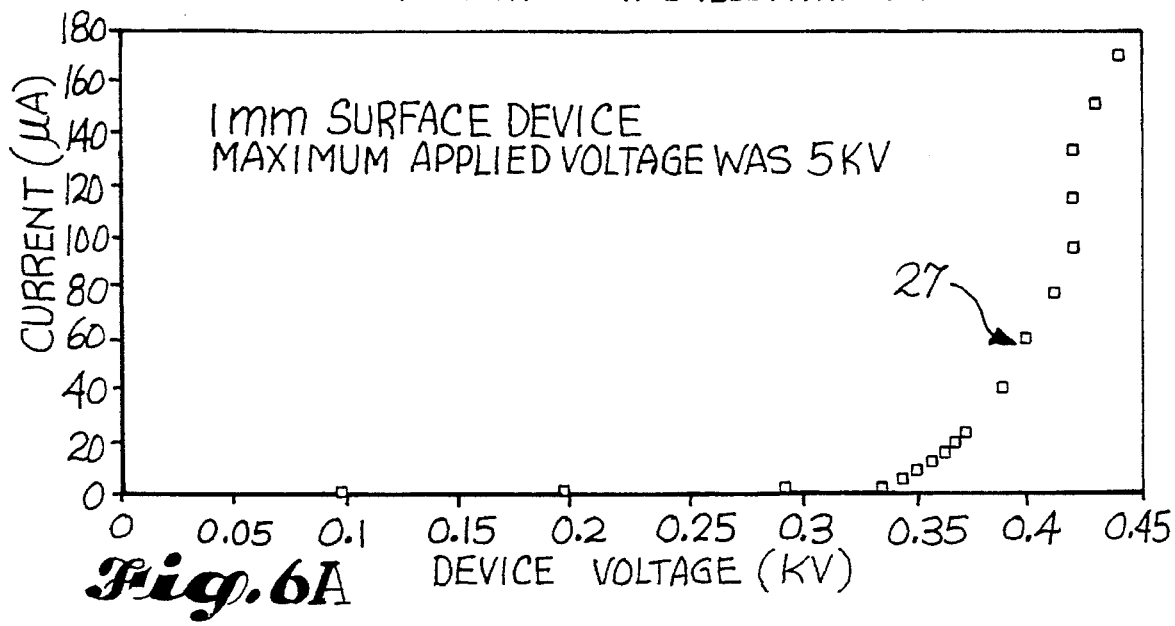
FIGS. 6a and 6b show measured I–V curves for photoconductors with 1 millimeter electrode gaps.
Figure 6B:
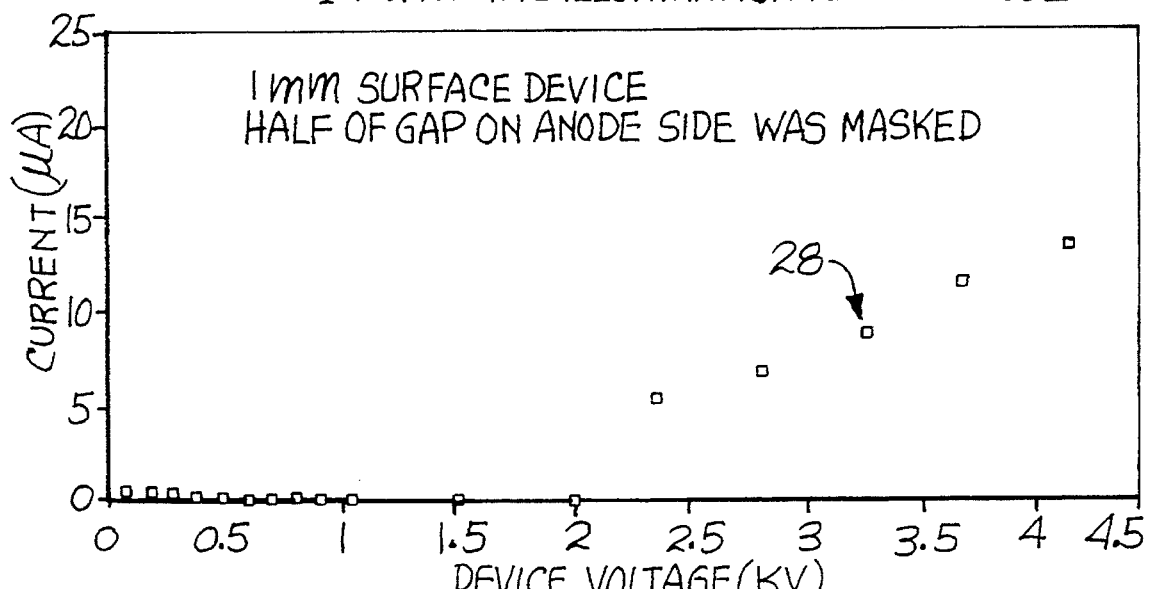

Devices which would originally not hold-off high voltage without background illumination from the YAG laser 14 showed dramatic improvement using this configuration as FIGS. 6a, b and 7a, b show. In these Figures, measured I–V data are plotted for two different surface geometries. FIG. 6a shows a typical curve 27 of a device without illumination and unable to hold-off high voltage. The electrode gap was 1 mm. FIG. 6b shows the I–V curve 28 of the same device using approximately 40 µW, 1.06 µm illumination near the cathode. The improvement in voltage stand-off is about an order of magnitude. A fairer comparison is the difference in device current with and without illumination for the same device voltage. For a device voltage of 0.4 kV, the current with and without illumination is 0.1 nA and 59 µA, respectively, which represents a decrease in device current draw of over 5 orders of magnitude.

Figure 7A:
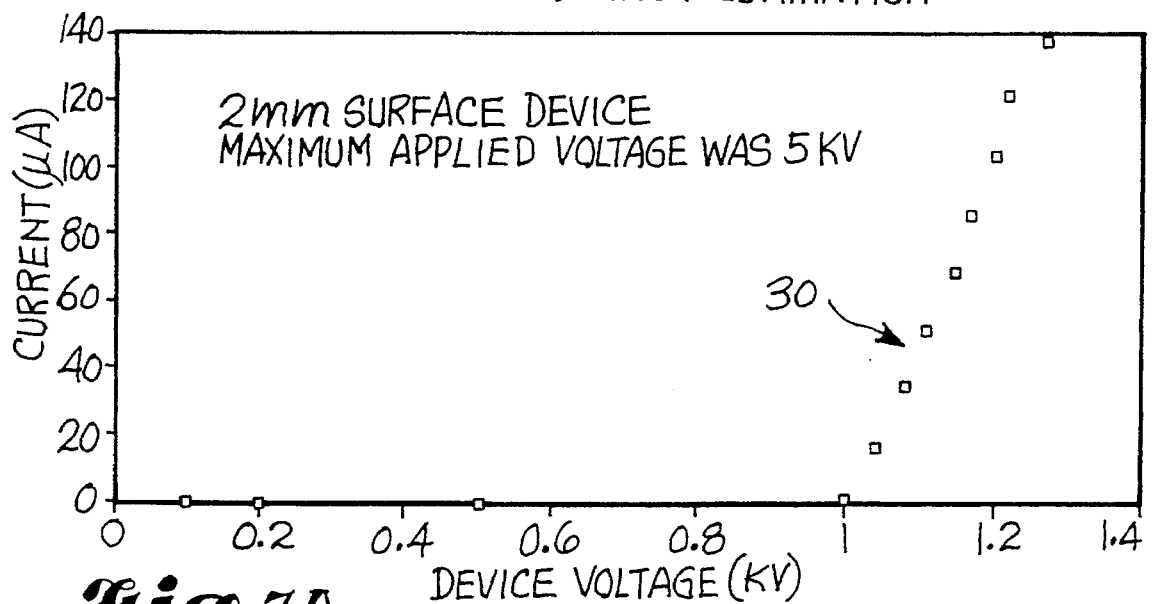
FIGS. 7a and 7b show measured I–V curves for photoconductors with 2 millimeter electrode gaps.
Figure 7B:
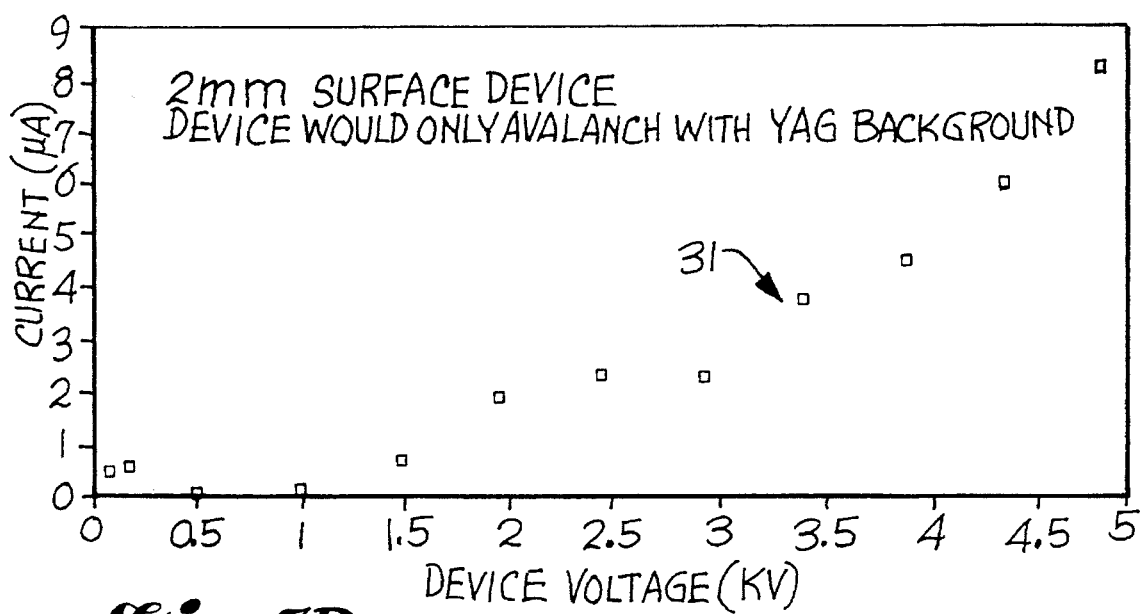

I–V data 30 for a different surface device with millimeter electrode spacing is shown in FIG. 7a. Again, 1.06 µm illumination near the cathode greatly improved high voltage hold-off, as shown by the curve 31 in FIG. 7b. At 5 KV applied bias, the device current with approximately 100 µW background illumination near the cathode was more than 15 times lower than without such illumination. This device would avalanche or "switch" when the 905 nm laser beam 22 was unblocked only in the presence of the 1.06 µm background light. Thus, the background light may also be used as a switch trigger.

The experiments were conducted by moving the illumination region until a minimum current draw was achieved.

The optimum size for the illumination region was generally less than the electrode gap spacing (generally about ¼ the gap length) and the optimum position was located near the electrode/semiconductor boundary of the cathode. This exercise of moving the illumination region for minimum current draw took very little time—less than a minute. An alternate method that eliminates this step is the following: Since the high carrier injection from high-field points is believed to be the effect that must be mitigated, and since one does not usually know a priori where on the electrode/semiconductor boundary such high-field points are dominant, one could simply illuminate a small region extending around the entire electrode/semiconductor boundary. This might be done using a mask and/or other appropriate optics between the optical source and the device to produce the illumination pattern described. This was done with the 1 mm gap surface photoconductor, where a mask covered half the device on the anode side, and the illuminated region was the unmasked cathode side of the device. The resulting improvement in I–V characteristics are those shown in FIG. 6. These experimental set-ups will suggest inexpensive and easily implemented manners of practicing the invention.

While preferred embodiments have been described, those skilled in the art will recognize modifications or variations which might be made without departing from the inventive concept. Therefore, the description and claims should be interpreted liberally with only such limitation as is necessary in view of the pertinent prior art.

What is claimed is:

1. A photoconductor device comprising:

a semiconductor substrate;

electrodes formed on said substrate; and a light source capable of illuminating at least a portion of at least one of said electrodes in a configuration which results in reducing the current draw of said photoconductor device compared to the current draw without illumination, thereby increasing the stand-off voltage of said photoconductor device.

2. The photoconductor device of claim 1 wherein said electrodes include a pair of electrodes separated by a distance of no more than two centimeters.

3. The photoconductor device of claim 1 wherein said light source includes an LED.

4. The photoconductor device of claim 1 wherein said light source comprises a YAG laser.

5. The photoconductor device of claim 1, wherein said light source comprises an incandescent lamp.

6. The photoconductor device of claim 1 wherein said light source includes a lens for focusing its light on said photoconductor device.

7. The photoconductor device of claim 6 wherein said light source and lens are movable in a plane parallel to the surface of the photoconductor device.

8. The photoconductor of claim 1, further comprising an optical element to direct illumination from said light source onto at least a portion of the boundary between said one of said electrodes and said substrate.

9. The device of claim 8 wherein said light source produces light of a wavelength which is absorbed in the substrate predominantly around said one of said electrodes.

10. The device of claim 9 wherein said electrodes are on one side of said substrate.

11. The device of claim 9 wherein said electrodes are on opposite sides of said substrate.

12. The device of claim 8 wherein said optical element is a mask.

13. The device of claim 8 wherein said optical element is a lens.

14. The device of claim 8 wherein said optical element directs said illumination onto substantially the entire boundary of said one of said electrodes.

* * * * *